United States Patent
Leibfried

(10) Patent No.: US 9,776,612 B2
(45) Date of Patent: Oct. 3, 2017

(54) METHOD FOR CHECKING AN AUTOMATIC PARKING BRAKE SYSTEM

(71) Applicant: Robert Bosch GmbH, Stuttgart (DE)

(72) Inventor: Oliver Leibfried, Siegelsbach (DE)

(73) Assignee: Robert Bosch GmbH, Stuttgart (DE)

( * ) Notice: Subject to any disclaimer, the term of this patent is extended or adjusted under 35 U.S.C. 154(b) by 34 days.

(21) Appl. No.: 14/615,556

(22) Filed: Feb. 6, 2015

(65) Prior Publication Data

US 2015/0217749 A1 Aug. 6, 2015

(30) Foreign Application Priority Data

Feb. 6, 2014 (DE) .................. 10 2014 202 198

(51) Int. Cl.
*G01R 31/02* (2006.01)
*B60T 17/22* (2006.01)
*G01R 31/00* (2006.01)
*B60T 13/58* (2006.01)
*B60T 13/74* (2006.01)
*F16D 55/226* (2006.01)
*G01R 31/34* (2006.01)

(52) U.S. Cl.
CPC .......... *B60T 17/221* (2013.01); *B60T 13/588* (2013.01); *B60T 13/741* (2013.01); *F16D 55/226* (2013.01); *G01R 31/006* (2013.01); *G01R 31/025* (2013.01); *G01R 31/34* (2013.01)

(58) Field of Classification Search
CPC .... G01R 31/34; G01R 31/006; G01R 31/025; F16D 55/226; B60T 13/741; B60T 13/588; B60T 17/221
See application file for complete search history.

(56) References Cited

U.S. PATENT DOCUMENTS

| | | | | |
|---|---|---|---|---|
| 3,837,532 A * | 9/1974 | Sahatjian | ............. | A01M 1/2055 222/23 |
| 3,875,463 A * | 4/1975 | Reuter | ................... | H02H 3/066 361/29 |
| 4,027,202 A * | 5/1977 | Tyler | ........................ | H02H 3/24 327/28 |
| 4,060,843 A * | 11/1977 | Bost | ........................ | H02H 3/253 361/76 |
| 4,210,948 A * | 7/1980 | Waltz | ...................... | G01R 29/16 324/86 |
| 4,262,382 A * | 4/1981 | Brown | ..................... | A47L 11/16 15/385 |
| 4,378,855 A * | 4/1983 | Haub | ........................ | B60L 3/02 15/340.4 |
| 4,611,154 A * | 9/1986 | Lambropoulos | ....... | H02H 3/087 318/434 |
| 4,649,742 A * | 3/1987 | Klausnitzer | .......... | B23Q 1/4809 73/115.03 |

(Continued)

FOREIGN PATENT DOCUMENTS

DE 10 2011 005 842 A1 9/2012

*Primary Examiner* — Jean-Paul Cass

(74) *Attorney, Agent, or Firm* — Maginot, Moore & Beck LLP

(57) ABSTRACT

A method for checking a functional state of an automatic parking brake system having a control unit and an actuator configured to generate an electromagnetic braking force includes actuating the actuator, using the control unit, at a first frequency higher than a second frequency. The second frequency is able to cause a rotation of the actuator.

13 Claims, 3 Drawing Sheets

(56) References Cited

U.S. PATENT DOCUMENTS

| | | | | |
|---|---|---|---|---|
| 5,023,527 A * | 6/1991 | Erdman | ............ | F23N 3/082 318/400.03 |
| 5,708,633 A * | 1/1998 | Hollen | ............ | B23P 21/00 359/813 |
| 5,729,145 A * | 3/1998 | Blades | ............ | G01R 31/1272 324/522 |
| 5,845,045 A * | 12/1998 | Jeske | ............ | H02P 6/08 318/400.11 |
| 5,883,578 A * | 3/1999 | Roberts | ............ | G01R 19/12 307/125 |
| 5,943,203 A * | 8/1999 | Wang | ............ | H02H 3/07 361/103 |
| 5,973,465 A * | 10/1999 | Rayner | ............ | F04B 47/06 318/459 |
| 6,493,244 B1 * | 12/2002 | Gray | ............ | H02J 3/01 361/159 |
| 6,698,847 B2 * | 3/2004 | Barberis | ............ | B61L 15/0036 303/3 |
| 6,756,750 B2 * | 6/2004 | Wakitani | ............ | B60L 7/003 180/19.2 |
| 7,038,423 B2 * | 5/2006 | Reed | ............ | H02P 29/02 318/727 |
| 7,242,562 B2 * | 7/2007 | Lin | ............ | H02H 7/093 318/485 |
| 7,355,436 B2 * | 4/2008 | Zehentner | ............ | G01R 31/42 318/490 |
| 7,969,107 B2 * | 6/2011 | Sakai | ............ | H02P 6/12 318/400.21 |
| 8,957,684 B2 * | 2/2015 | Heise | ............ | B60T 7/042 324/415 |
| 9,033,117 B2 * | 5/2015 | Ma | ............ | B60T 13/741 188/157 |
| 9,329,242 B2 * | 5/2016 | Schmidt | ............ | G01R 31/40 |
| 2004/0162704 A1 * | 8/2004 | Siegel | ............ | G05B 19/406 702/183 |
| 2006/0080495 A1 * | 4/2006 | Glaser | ............ | H04L 7/06 711/4 |
| 2008/0054857 A1 * | 3/2008 | Cook | ............ | H02P 1/22 322/13 |
| 2008/0116898 A1 * | 5/2008 | Washington | ............ | H02P 7/00 324/521 |
| 2010/0025141 A1 * | 2/2010 | Bensch | ............ | B60T 13/683 180/271 |
| 2010/0287604 A1 * | 11/2010 | Potkonjak | ............ | G06F 21/73 726/6 |
| 2012/0299573 A1 * | 11/2012 | Vangool | ............ | H01F 38/32 323/358 |
| 2014/0001756 A1 * | 1/2014 | Panosyan | ............ | H02K 49/046 290/7 |
| 2015/0040679 A1 * | 2/2015 | Edelson | ............ | G01M 17/0074 73/802 |
| 2015/0318705 A1 * | 11/2015 | Lucas | ............ | H02J 3/381 307/129 |
| 2016/0017940 A1 * | 1/2016 | Eckerle | ............ | F16D 48/064 192/41 R |
| 2016/0231382 A1 * | 8/2016 | Hirose | ............ | G01R 31/3277 |
| 2016/0373018 A1 * | 12/2016 | Burgermeister | ............ | G01R 31/025 |

\* cited by examiner

METHOD FOR CHECKING AN AUTOMATIC PARKING BRAKE SYSTEM

This application claims priority under 35 U.S.C. §119 to patent application no. DE 10 2014 202 198.7 filed on Feb. 6, 2014 in Germany, the disclosure of which is incorporated herein by reference in its entirety.

The disclosure relates to a method for checking a functional state of an automatic parking brake system, in particular to a method for short-circuit identification, to a control and/or regulating device and to an automatic parking brake system.

BACKGROUND

An automatic parking brake (APB) is known, for example, from DE 10 2011 005 842 A1. Said automatic parking brake comprises a control unit which interacts with two actuators which are in each case arranged on the two rear wheels of a motor vehicle. An actuator of this kind is generally a (DC) electric motor which can shift a brake piston by means of a gear mechanism and a spindle drive in order to exert a clamping force on a brake disk. Owing to this mechanical locking, the automatic parking brake replaces the parking brake function, which is usually realized by means of Bowden cables, of a conventional handbrake. The control unit for the automatic parking brake is located either in the interior of the vehicle or is integrated into an existing control device, such as the electronic stability control device ESC for example. In order to actuate the two actuators, the control unit is connected to said actuators via lines, in particular via copper lines, which are laid in the vehicle. Laying the lines from the vehicle body, in particular from the wheel arch, to the actuators which are arranged on the rear axles presents a particular challenge when laying the cables since, at this point, the lines are freely accessible and subject to considerable stresses due to environmental influences, such as being struck by stones, moisture, being bitten by rodents etc. Stresses of this kind can damage the lines and this can lead to short circuits. These short circuits generate an overcurrent, which can have a negative impact on the functioning of the parking brake. Therefore, it is of critical importance for reliable operation of the automatic parking brake that a short circuit which may occur on said lines is identified and indicated to the driver.

In conventional systems, short-circuit identification in the parking brake system is realized by monitoring the current carried in the lines, so that, in the case of a short-circuited actuator, the overcurrent is detected and the actuator is consequently switched off. However, in order to be able to detect an overcurrent at all, detection of this kind takes place only in the actuation state of the actuator, that is to say only when the parking brake is applied. Short-circuit identification between the two feed lines which connect the actuator to the control unit has, to date, not been possible when the actuator is not in the actuation state. In particular, actuation of the actuator during driving of a vehicle for checking the connecting lines for short circuits cannot be carried out since the actuator, which is associated with a rear wheel, would move during actuation and consequently would initiate a parking brake function during driving of the vehicle.

SUMMARY

The object of the present disclosure is therefore to provide a method for checking a functional state of an automatic parking brake system, which method can be carried out during driving of a vehicle.

The object is achieved by the features of the independent patent claims. Developments of the disclosure are specified in the dependent claims.

A method according to the disclosure serves to check a functional state of an automatic parking brake system and, in particular, to identify a short circuit, wherein the method preferably has a control unit and also an actuator for generating an electromechanical braking force, wherein the control unit actuates the actuator at a frequency which is higher than a frequency which can cause rotation of the actuator. The frequency is therefore selected such that it leaves a stationary state of the actuator substantially uninfluenced. In this case, the frequency is preferably selected depending on the mass inertia of the actuator (2).

The method according to the disclosure is particularly advantageous because, in contrast to conventional methods, it allows short-circuit identification during driving of a vehicle too. Since the frequency of the actuating signal does not cause rotation of the actuator, which is usually in the form of a DC motor, short-circuit measurement can be carried out during operation of the vehicle. Damage to the lines of the automatic parking brake system and associated functional adverse effects can consequently not be initially established when the parking brake is operated, but rather advantageously immediately after the adverse effect is produced. The frequency of the actuating signal is preferably matched to the mass inertia of the actuator in order to avoid actuator movement. Furthermore, no additional components are required for the method according to the disclosure, but rather said method according to the disclosure can be implemented, for example, by programs in a control and/or regulating device.

Advantageously, the actuator current resulting from the high-frequency actuation can be measured by means of a current-measuring unit in the method. The current-measuring unit is preferably a component of the control unit, which component is provided to calculate the clamping force of the parking brake, it being possible for said current-measuring unit to be used during driving in order to detect the current resulting from the actuation of the actuator. In order to draw a conclusion about the operating state of the automatic parking brake system from the detected current, the measured current is evaluated. In particular, comparison with suitable threshold values can be performed, this allowing a decision to be made about the state of the parking brake system.

A high-frequency actuator actuating signal is advantageously generated by means of an H-bridge circuit of the control unit, wherein the H-bridge circuit comprises a plurality of, in particular four, switching elements. The high-frequency actuator actuating signal is consequently generated by suitable high-frequency actuation of the switching elements, for example by means of a square-wave signal. The frequency of the actuator actuating signal depends on the frequency of the actuating signal for the switching elements of the H-bridge circuit in this case.

The switching frequency of the switching elements and consequently the polarity-reversal frequency of the actuator are advantageously between 10 kHz and 50 kHz. However, the frequency is preferably approximately 25 kHz. The polarity of the actuator is preferably reversed at the frequency of the high-frequency actuator actuating signal. It is critical that the frequency is selected in such a way that the polarity of the electric motor is reversed quickly enough that the electric motor cannot be moved, owing to its mass inertia, when the parking brake system is intact.

In order to be able to draw conclusions about the operating state of the parking brake system from the actuator actuating signal, the actuator current possibly resulting from the high-frequency actuation is preferably evaluated. Owing to the evaluation, a conclusion can then advantageously be drawn about the state of the lines, for example that there is an interruption in at least one of the lines, or that there is a short circuit between the lines or else that there is a normal operating state.

In a normal operating state of the parking brake system, a capacitor, in particular an interference-suppression capacitor of the actuator, advantageously generates a measurable idle current on account of the actuator actuating signal. A normal operating state of the automatic parking brake system can be clearly identified in this way since an idle current of this kind is not generated in the event of idling or a short circuit of the feed lines. When an idle current is present, the conclusion that the automatic parking brake is in a normal operating mode can consequently be clearly drawn.

It is particularly advantageous when the method for short-circuit identification is carried out continuously or at periodic intervals during driving of a vehicle. In this way, it is ensured as early as during operation of the vehicle that the parking brake is fully functional and can reliably hold a vehicle in a stationary state.

The method according to the disclosure runs in a regulating and/or control device in a motor vehicle, which regulating and/or control device can be a constituent part of the automatic parking brake system.

BRIEF DESCRIPTION OF THE DRAWINGS

Further features and advantages of the disclosure can be found in the description of exemplary embodiments with reference to the appended drawings, in which.

DETAILED DESCRIPTION

Figure 1:
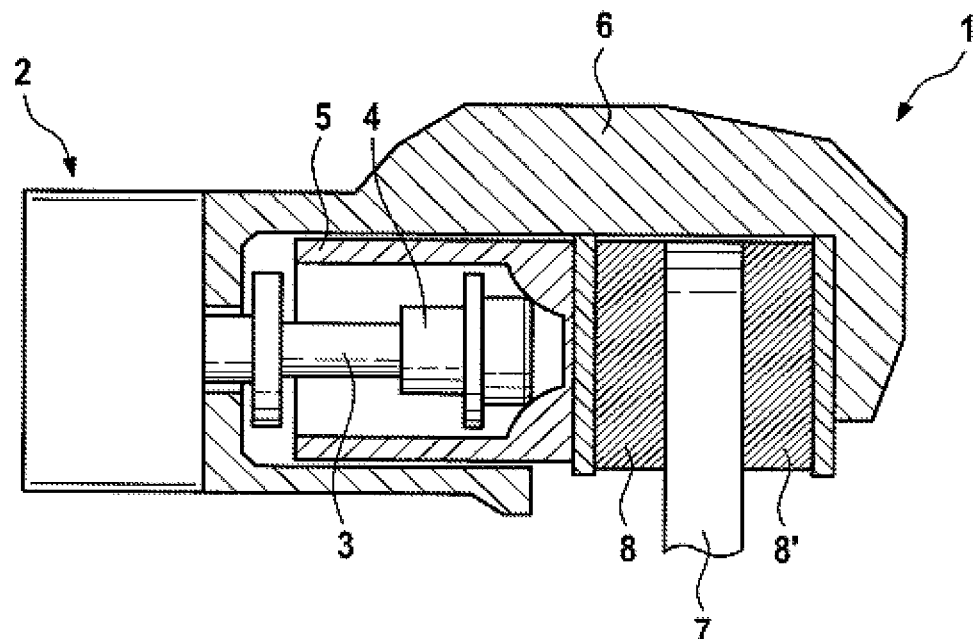
FIG. 1 shows a sectional view through an automatic parking brake for a vehicle, having an electric brake motor for generating a clamping force which holds the vehicle.

FIG. 1 shows a sectional view through an automatic (automated) parking brake 1 for a vehicle, which parking brake can exert a clamping force, for holding the vehicle, by means of an actuator 2 (brake motor) which is in the form of a DC motor in the present case. The actuator 2 drives a spindle 3, in particular a threaded spindle, which is mounted in an axial direction. At its end which is averted from the actuator 2, the spindle 3 is provided with a spindle nut 4 which, when the parking brake 1 is in the applied state, bears against an inner end face or a rear face of a brake piston 5. In the event of a rotary movement of the actuator 2 and a resulting rotary movement of the spindle 3, the spindle nut 4 is shifted in the axial direction. The spindle nut 4 and the brake piston 5 are mounted in a brake caliper 6 which engages over a brake disk 7 in the manner of tongs. A respective brake lining 8, 8' is arranged on both sides of the brake disk 7.

In the event of an application process of the parking brake 1, the electric motor (actuator 2) rotates, as a result of which the spindle nut 4 is moved toward the brake disk 7 in the axial direction until it exerts a predetermined maximum clamping force on the brake piston 5.

Figure 2:
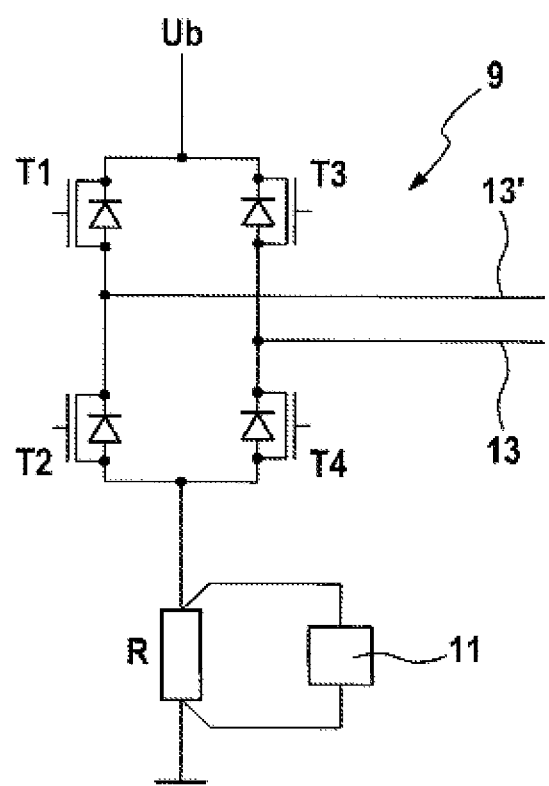
FIG. 2 shows a schematic circuit diagram of a portion of the control unit with an H-bridge circuit for actuating the actuator and a current-measuring unit for measuring the motor current.

The actuator 2 is actuated by means of a control unit, not shown in FIG. 1, which may be, for example, a control device of an electronic stability system, such as an ABS (anti-lock brake system), ESP (electronic stability program) or EHB (electrohydraulic brake). FIG. 2 shows a detail of a control unit of this type with an H-bridge circuit 9. The H-bridge circuit 9 comprises a total of four switching elements T1 to T4 which may be, in particular, transistors, and preferably MOSFETs. The H-bridge circuit 9 generates an actuator actuating signal which is supplied to the actuator 2, shown in FIG. 1, via lines 13, 13'. The H-bridge circuit 9 is actuated in such a way that the polarity of the actuating signal is reversed depending on the desired rotation direction of the actuator 2. Specifically, the switching elements T1 and T4 are switched on and the switching elements T2 and T3 are switched off in order to generate a first rotation direction of the actuator 2, while the switching elements T2 and T3 are switched on and the switching elements T1 and T4 are switched off in order to generate an opposite second rotation direction of the actuator.

Furthermore, the control unit comprises a current-measuring unit 11 which, in the present case, has a shunt resistor R which is connected in the supply voltage path $U_b$ of the H-bridge circuit 9. The shunt resistor R is connected to a measuring amplifier 17 which serves to measure the current (actuator current) resulting from the operation of the H-bridge circuit 9 and received by the actuator 2. During normal operation of the parking brake, the actuator current is used to determine the clamping force of the actuator with the aid of a suitable algorithm.

Figure 3:
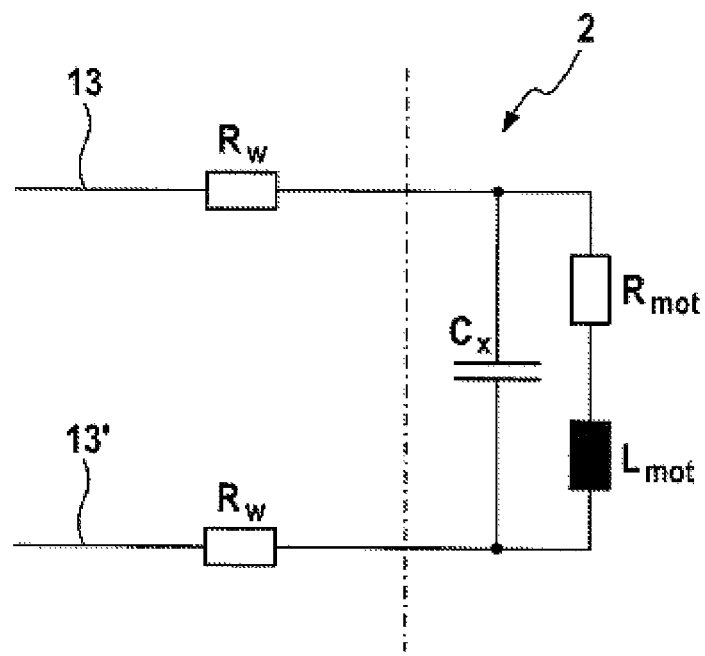
FIG. 3 shows a schematic equivalent circuit diagram of an automatic parking brake with a DC motor.

FIG. 3 shows a schematic equivalent circuit diagram or an electrical model of an automatic parking brake 1 having a DC motor as actuator 2. In this case, the actuator 2 and the feed lines 13, 13' form a load which is connected to the control unit. The feed lines 13, 13' which are connected to the H-bridge circuit 9 are each illustrated as feed line resistors $R_w$ since these mainly exhibit a non-reactive behavior. In the inoperative state, the brake motor can be approximately described by a motor inductance $L_{mot}$ and a winding resistance $R_{mot}$. Furthermore, the DC motor generally comprises an interference-suppression capacitor $C_x$ which is intended to improve the electromagnetic emission behavior of the motor and which is connected in parallel with the motor inductance $L_{mot}$ and the winding resistance $R_{mot}$.

Figure 4:
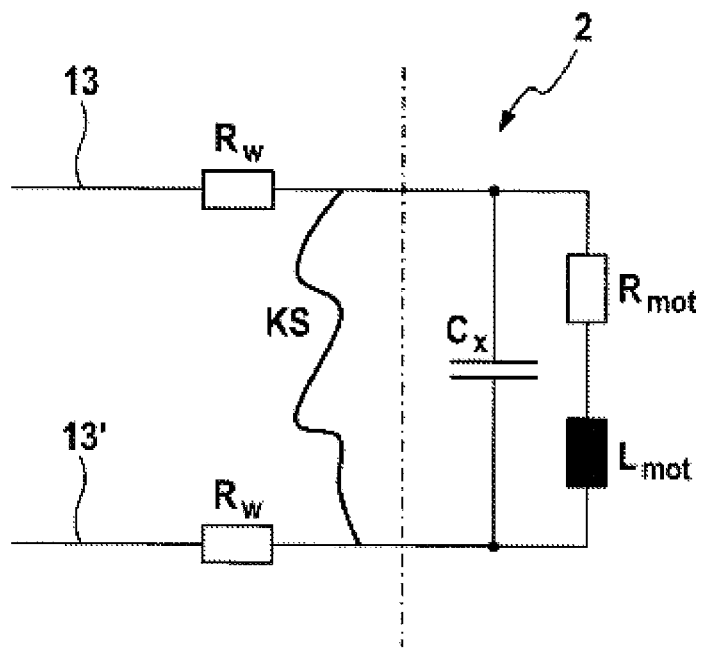
FIG. 4 shows a schematic equivalent circuit diagram of an automatic parking brake with a DC motor in the short-circuited state.

In the event of a short circuit KS, indicated in FIG. 4, between the two feed lines 13, 13' in the automatic parking brake system, which results, for example, from damage and resulting contact of the two feed lines 13, 13', the load owing to the short circuit in the motor inductance $L_{mot}$ still exhibits a non-reactive behavior on account of the line resistance R. This line resistance $R_w$ moves in the milliohm range, so that a high DC current would be necessary in order to be able to distinguish between an intact line and a defective line during driving and consequently detect the short circuit. As was mentioned in the introductory part, it is, however, not possible to supply a high DC current for checking the functioning of the parking brake system during driving because, in the case of an intact line, this would result in a movement of the actuator 2 and therefore the generation of a clamping force. Therefore, this possible way of identifying a short circuit is restricted to use during operation of the parking brake 1 when the vehicle is stationary.

In contrast, the method according to the disclosure allows short-circuit identification at any time during driving of the vehicle, without the risk of the automatic parking brake 1 being operated. To this end, the method makes use of the fact that the actuator 2 can indeed be operated in opposite rotation directions and therefore can be operated with two different current directions, but on account of the mass inertia of the actuator 2, this can no longer take place starting from a specific frequency of the actuating signal. Therefore, when the frequency of the actuating signal exceeds a specific limit value which depends on the mass inertia of the actuator 2, the actuator 2 will not move in spite of an actuating signal being supplied. The actuating signal is a current which is generated by actuating the switching elements T1 to T4 of the H-bridge circuit 9 and by providing a suitable supply voltage $U_b$. As has already been described, the current direction and therefore the rotation direction of the actuator 2 can be changed by corresponding actuation of the switching elements T1 to T4 of the H-bridge circuit.

Movement of the actuator 2 during driving is prevented due to high-frequency actuation of the actuator 2 which therefore causes high-frequency polarity reversal of the actuator 2. In other words, a stationary state of the actuator 2 remains uninfluenced by the high-frequency actuating signal. The high-frequency actuating signal can now advantageously be used without the risk of operation of the automatic parking brake 1 during driving of a vehicle for short-circuit identification in the automatic parking brake system. In the present case, the term "high-frequency" is to be understood to mean a frequency on account of which the actuator 2 remains in the stationary state on account of its mass inertia.

Figure 5:
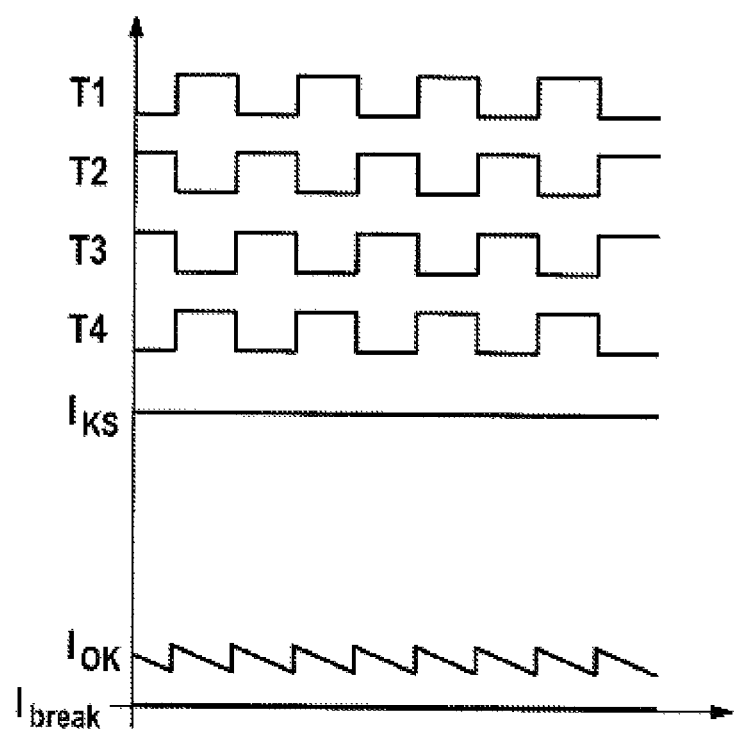
FIG. 5 shows a graph with actuating signals of the switching elements of an H-bridge circuit and the resulting actuator current which is measured by means of a current-measuring unit.

FIG. 5 shows a graph with exemplary actuating signals of the switching elements T1 to T4 of the H-bridge circuit 9 and of the resulting actuator current which is measured by means of the current-measuring unit 11. The switching elements T1 to T4 are switched at a high frequency in order to generate a high-frequency actuating signal which is supplied to the actuator 2 via the lines 13, 13'. In this case, the switching elements T1 and T4 and, respectively, T2 and T3 are switched on alternately. The current direction of the actuating signal is consequently switched over at the same frequency. The frequency can be, for example, 25 kHz in order to reliably preclude movement of the actuator 2. The frequency of the actuating signal is advantageously also outside the range which is audible to humans, so that the vehicle occupants cannot hear that the functioning of the automatic parking brake system is being checked.

The functioning of the automatic parking brake system can now be fully checked owing to the high-frequency actuating signal being generated and supplied: in the event of a short circuit KS of the feed lines 13, 13' as shown in FIG. 4, a high alternating current flows through the low-resistance line resistor during the functional test. This alternating current, which is identified by $I_{KS}$ in FIG. 5, can be detected in the current-measuring unit 11 of the control unit. The measured current can be compared, for example, with a prespecified threshold value in order to therefore reliably draw the conclusion that there is a high alternating current which is generated as a result of a short circuit.

In the event of the motor feed lines 13, 13' not having a short circuit, but rather an interruption, no current can flow in the automatic parking brake system and consequently no current is measured in the current-measuring unit 11. In FIG. 5, the measurable current consequently has the value zero and is identified by $I_{break}$. Consequently, if no measurable current results from the test actuation of the switching elements T1 to T4, the conclusion can be drawn that there is a line interruption in the parking brake system.

If, however, the feed lines 13, 13' of the parking brake system are neither short-circuited nor interrupted, the high-frequency actuating signal will flow through the interference-suppression capacitor $C_x$ of the actuator 2 and be detected in the form of a low idle current of from less than 100 mA to a few amperes in the current-measuring unit 11 during testing. In this case, the magnitude of the idle current depends on the value of the capacitor $C_x$ and of the actuating frequency. In FIG. 5, the measurable idle current of the capacitor $C_x$ is identified by $I_{OK}$. This current has a periodically fluctuating profile which is typical of capacitors and can be easily identified.

Therefore, overall, three different states of an automatic parking brake system can be reliably determined by the method according to the disclosure by means of high-frequency actuation of the actuator 2 during driving of the vehicle. The actuator currents resulting from the high-frequency actuation can be measured by the current-measuring unit 11 which is already present in conventional parking brake systems. In this case, three cases can occur depending on the state of the parking brake system, said cases indicating an interruption, a short circuit in the system or an intact state. The actuator current resulting from the high-frequency actuation and measured by the current-measuring unit 11 is zero, has a high short-circuit level or a low idle-current level, depending on the state of the system. If a capacitor is not provided in the actuator 2, said actuator can be retrofitted for carrying out the method according to the disclosure for short-circuit identification, or another suitable passive or possibly also an active component is integrated into the parking brake system, and in particular into the actuator 2, in order to identify an intact state.

Owing to high-frequency actuation of the H-bridge circuit 9, the risk of movement of the actuator 2 during driving of a vehicle is precluded, wherein a movement can result in an intact state of the automatic parking brake system.

In order to evaluate the currents measured during testing, a suitable algorithm can be implemented in the respective control device, said algorithm comparing the measured current with threshold values and in this way being able to determine the state of the automatic parking brake system. In this case, the threshold values are preferably matched to the respective frequency used and, in particular, also to the parameters of the passive component (capacitor $C_x$).

In the event of a fault in operation being identified, in particular in the event of an interruption or a short circuit, a fault in the functioning of the automatic parking brake system can already be indicated to the driver during driving. Furthermore, an emergency parking brake function can be initiated if necessary, said emergency parking brake function causing, for example, fully hydraulic operation of the parking brake in the stationary state of the vehicle until the fault in operation of the automatic parking brake system is remedied.

What is claimed is:
1. A method for checking a functional state of an automatic parking brake system having a control unit and a DC motor configured to generate an electromagnetic braking force, the method comprising:

applying, with the control unit, an AC voltage to feed lines of the DC motor, the AC voltage having a predetermined frequency such that the DC motor does not rotate;

measuring, with the control unit, during the applying of the AC voltage to the feed lines of the DC motor, a current flowing through the feed lines of the DC motor using a current-measuring unit;

determining, with the control unit, that there is a short circuit in the feed lines of the DC motor in response to the measured current being greater than a predetermined threshold; and determining, with the control unit, that there is an interruption in the feed lines of the DC motor in response to the measured current being equal to zero.

2. The method according to claim 1, the checking further comprising:

determining, with the control unit, that the automatic parking brake system is in a first operating state if the measured current corresponds to an expected current resulting from an interference-suppression capacitor of the DC motor.

3. The method according to claim 1, further comprising:
generating the AC voltage by operating an H-bridge circuit of the control unit.

4. The method according to claim 1, wherein the frequency of the AC voltage is between 10 kHz and 50 kHz.

5. The method according to claim 1, the checking further comprising:

determining that the automatic parking brake system is in a first operating state if the measured current corresponds to an expected current resulting from a capacitance of the DC motor.

6. The method according to claim 1, further comprising:
performing processes of applying, measuring, determining that there is a short circuit, and determining that there is an interruption one of (i) continuously and (ii) at periodic intervals during driving of a vehicle.

7. The method according to claim 1, further comprising:
selecting the frequency of the AC voltage depending on a mass inertia of the DC motor.

8. The method according to claim 4, wherein the frequency of the AC voltage is between 20 kHz and 40 kHz.

9. A regulating device configured to check a functional state of an automatic parking brake system using a method, the parking brake system having a control unit and a DC motor configured to generate an electromagnetic braking force, the method comprising:

applying, with the regulating device, an AC voltage to feed lines of the DC motor, the AC voltage having a predetermined frequency such that the DC motor does not rotate;

measuring, with the regulating device, during the applying of the AC voltage to the feed lines of the DC motor, a current flowing through the feed lines of the DC motor using a current-measuring unit;

determining, with the regulating device, that there is a short circuit in the feed lines of the DC motor in response to the measured current being greater than a predetermined threshold; and determining, with the regulating device, that there is an interruption in the feed lines of the DC motor in response to the measured current being equal to zero.

10. The regulating device according to claim 9, wherein the regulating device is included in the automatic parking brake system of a motor vehicle.

11. A control device configured to check a functional state of an automatic parking brake system using a method, the parking brake system having a control unit and a DC motor configured to generate an electromagnetic braking force, the method comprising:

applying, with the control device, an AC voltage to feed lines of the DC motor, the AC voltage having a predetermined frequency such that the DC motor does not rotate;

measuring, with the control device, during the applying of the AC voltage to the feed lines of the DC motor, a current flowing through the feed lines of the DC motor using a current-measuring unit;

determining, with the control device, that there is a short circuit in the feed lines of the DC motor in response to the measured current being greater than a predetermined threshold; and determining, with the control device, that there is an interruption in the feed lines of the DC motor in response to the measured current being equal to zero.

12. The control device according to claim 11, wherein the control device is included in the automatic parking brake system of a motor vehicle.

13. The method according to claim 8, wherein the frequency of the AC voltage is 25 kHz.

* * * * *